(12) United States Patent
Zhou (10) Patent No.: US 11,374,116 B2
(45) Date of Patent: Jun. 28, 2022

(54) SEMICONDUCTOR DEVICES (71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 17/197,423

(22) Filed: Mar. 10, 2021

(65) Prior Publication Data
US 2021/0202720 A1 Jul. 1, 2021

Related U.S. Application Data (62) Division of application No. 16/559,081, filed on Sep. 3, 2019, now Pat. No. 10,978,577.

(30) Foreign Application Priority Data

Sep. 26, 2018 (CN) .......................... 201811124658.8

(51) Int. Cl.
*H01L 29/66* (2006.01)
*H01L 21/3065* (2006.01)
(Continued)

(52) U.S. Cl.
CPC .... *H01L 29/66795* (2013.01); *H01L 21/3065* (2013.01); *H01L 21/3086* (2013.01); *H01L 29/0847* (2013.01); *H01L 29/6653* (2013.01); *H01L 29/6656* (2013.01); *H01L 29/785* (2013.01); *H01L 21/02532* (2013.01); *H01L 21/02576* (2013.01); *H01L 21/02579* (2013.01)

(58) Field of Classification Search
CPC .......... H01L 29/66795; H01L 21/3065; H01L 21/3086; H01L 29/0847; H01L 29/6653; H01L 29/6656; H01L 29/785; H01L 21/02532
USPC .......................... 257/401, 379; 438/284, 286
See application file for complete search history.

(56) References Cited

U.S. PATENT DOCUMENTS

| 2015/0270349 A1 | 9/2015 | Cheng et al. |
| 2018/0040708 A1* | 2/2018 | Narayanan et al. .................. H01L 219/513 438/287 |

* cited by examiner

*Primary Examiner* — Thinh T Nguyen
(74) *Attorney, Agent, or Firm* — Anova Law Group, PLLC (57) ABSTRACT

A semiconductor device includes: a substrate; a fin structure and a gate structure formed on the substrate; and a source/drain trench formed in the fin structure on each side of the gate structure. The source/drain trench includes a bottom region and a top region located above the bottom region. Along an extension direction of the fin structure, a dimension of the top region is larger than a dimension of the bottom region. Along the extension direction of the fin structure, a shortest distance from a sidewall surface of the top region of the source/drain trench to a sidewall surface of the gate structure is smaller than a shortest distance from a sidewall surface of the bottom region of the source/drain trench to the sidewall surface of the gate structure. The semiconductor device further includes a source/drain doped layer formed in the source/drain trench.

13 Claims, 7 Drawing Sheets

(51) Int. Cl.
*H01L 29/08* (2006.01)
*H01L 29/78* (2006.01)
*H01L 21/308* (2006.01)
*H01L 21/02* (2006.01)

SEMICONDUCTOR DEVICES

CROSS-REFERENCES TO RELATED APPLICATIONS

This application is a divisional of U.S. patent application Ser. No. 16/559,081, filed on Sep. 3, 2019, which claims the priority of Chinese Patent Application No. CN201811124658.8, filed on Sep. 26, 2018, the entire content of which is incorporated herein by reference.

FIELD OF THE DISCLOSURE

The present disclosure generally relates to the field of semiconductor fabrication technology and, more particularly, relates to semiconductor devices and fabrication methods thereof.

BACKGROUND

With the rapid development of semiconductor manufacturing technology, semiconductor devices are moving toward having higher component densities and higher integration. As the most basic semiconductor device, field-effect transistor (FET) has been widely used in semiconductor industry. The control of the channel current in conventional planar FETs becomes weaker, which results in the short channel effect (SCE), leads to a leakage current, and ultimately affects the electrical performance of the semiconductor device.

In current technology, a fin field-effect transistor (Fin FET) has been proposed to overcome the SCE and suppress the leakage current in semiconductor devices. The Fin FET is a common multi-gate device and includes a fin structure and an isolation layer disposed on the surface of a semiconductor substrate. The isolation layer covers a portion of the sidewall of the fin structure, and the surface of the isolation layer is lower than the top of the fin structure. The Fin FET also includes a gate structure formed on the surface of the isolation layer and covering the top and sidewall surfaces of the fin structure; and a source region and a drain region formed in the fin structure on the two sides of the gate structure, respectively.

However, the performance of semiconductor devices fabricated based on the existing technology may still need to be improved, the disclosed semiconductor structures and fabrication methods thereof are directed to solve one or more problems set forth above and other problems in the art.

BRIEF SUMMARY OF THE DISCLOSURE

One aspect of the present disclosure provides a method for fabricating a semiconductor device. The method includes forming a fin structure and a gate structure on a substrate. The gate structure is formed across the fin structure, and covers a portion of top and sidewall surfaces of the fin structure. The method also includes forming a source/drain trench in the fin structure on each side of the gate structure. The source/drain trench includes a bottom region and a top region located above the bottom region. Along an extension direction of the fin structure, the dimension of the top region of the source/drain trench is larger than the dimension of the bottom region of the source/drain trench. Along the extension direction of the fin structure, the shortest distance from a sidewall surface of the top region of the source/drain trench to a sidewall surface of the gate structure is smaller than the shortest distance from a sidewall surface of the bottom region of the source/drain trench to the sidewall surface of the gate structure. The method further includes forming a source/drain doped layer in the source/drain trench.

Another aspect of the present disclosure provides a semiconductor device. The semiconductor device includes a substrate; and a fin structure and a gate structure formed on the substrate. The gate structure is formed across the fin structure and covers a portion of top and sidewall surfaces of the fin structure. The semiconductor device further includes a source/drain trench formed in the fin structure on each side of the gate structure. The source/drain trench includes a bottom region and a top region located above the bottom region. Along an extension direction of the fin structure, the dimension of the top region is larger than the dimension of the bottom region. Along the extension direction of the fin structure, the shortest distance from the sidewall surface of the top region of the source/drain trench to the sidewall surface of the gate structure is smaller than the shortest distance from the sidewall surface of the bottom region of the source/drain trench to the sidewall surface of the gate structure. The semiconductor device further includes a source/drain doped layer formed in the source/drain trench.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
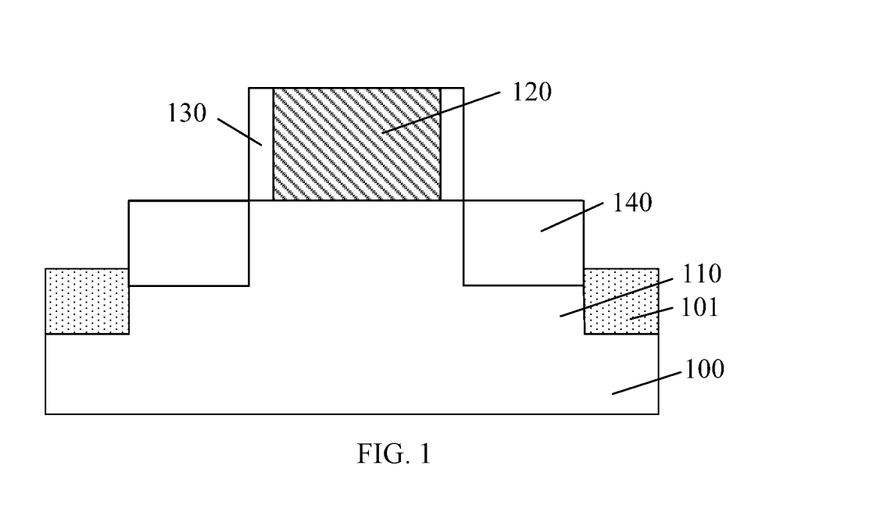
FIG. 1 illustrates a schematic view of a semiconductor device.

In current technology, the performance of semiconductor devices may still need to be improved. FIG. 1 illustrates a schematic view of a semiconductor device. Referring to FIG. 1, the semiconductor device includes a substrate, a fin structure 110 and an isolation structure 101 formed on the surface of the substrate 100, a gate structure 120 formed on the isolation structure 101 and across the fin structure 110, a sidewall spacer 130 on each sidewall of the gate structure 120, a source/drain doped layer 140 formed in the fin structure 110 on the side of each sidewall spacer 130 away from the gate structure 120. The source/drain doped layer 140 contains source/drain doping ions.

With the development of semiconductor technology, the feature size of semiconductor devices continuously decreases, and the channel length of Fin-FET also continuously becomes shorter. When voltages are respectively applied to the gate structure 120 and the source/drain doped layer 140 of the Fin-FET, a depletion layer is generated in the channel region. The depletion layer in the top region of the channel is mainly controlled by the voltage on the gate structure, such that the probability of generating the SCE is small. The bottom region of the channel is far away from the gate structure 120. Therefore, the voltage on the gate structure has less influence on the depletion region in the bottom region of the channel, and the thickness of the depletion layer in the bottom region of the channel is mainly controlled by the voltage on the source/drain doped layer 140. When the thickness of the depletion layer in the bottom region of the channel is larger than the length of the channel, the SCE may be easily caused. In order to reduce the SCE for the bottom region of the channel, a commonly-adopted method is to heavily dope the bottom region of the channel. However, for doping ions with a high concentration, the doping ions are unstable, and thus may easily diffuse into the top region of the channel during a thermal process, leading to an increase in the threshold voltage of the transistor, and further degrading the performance of the semiconductor device.

The present disclosure provides a method for fabricating semiconductor devices. According to the method, a source/drain trench is formed in the fin structure on each side of the gate structure. Each source/drain trench includes a bottom region and a top region. The sidewall of the top region of the source/drain trench protrudes from the sidewall of the bottom region of the source/drain trench. That is, the distance between the two sidewalls of the top regions of the source/drain trenches is smaller than the distance between the two sidewalls of the bottom regions of the source/drain trenches. As such, the length of the fin structure between the bottom regions of the two source/drain trenches is large, that is, the channel between the two portions of the source/drain doped layer located respectively in the bottom regions of the two source/drain trenches is long. Therefore, the SCE between the two portions of the source/drain doped layer in the bottom regions of the two source/drain trenches is suppressed, and the disclosed method improves the performance of the semiconductor device.

Figure 12:
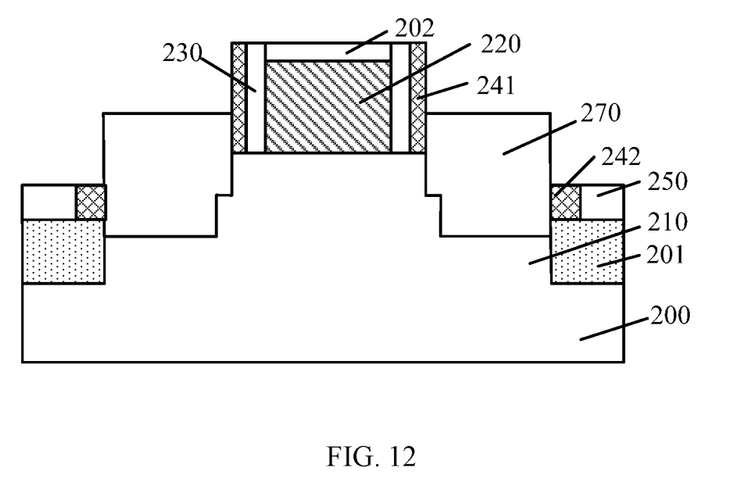
Figure 13:
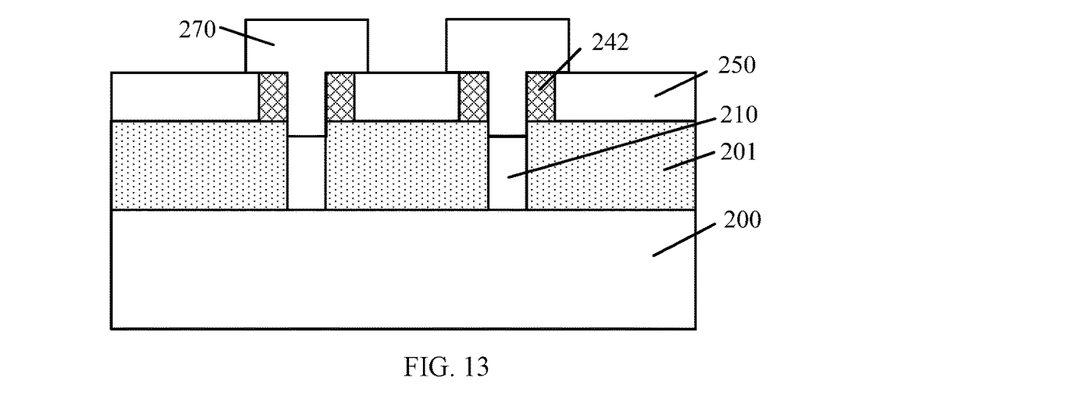
Figure 14:
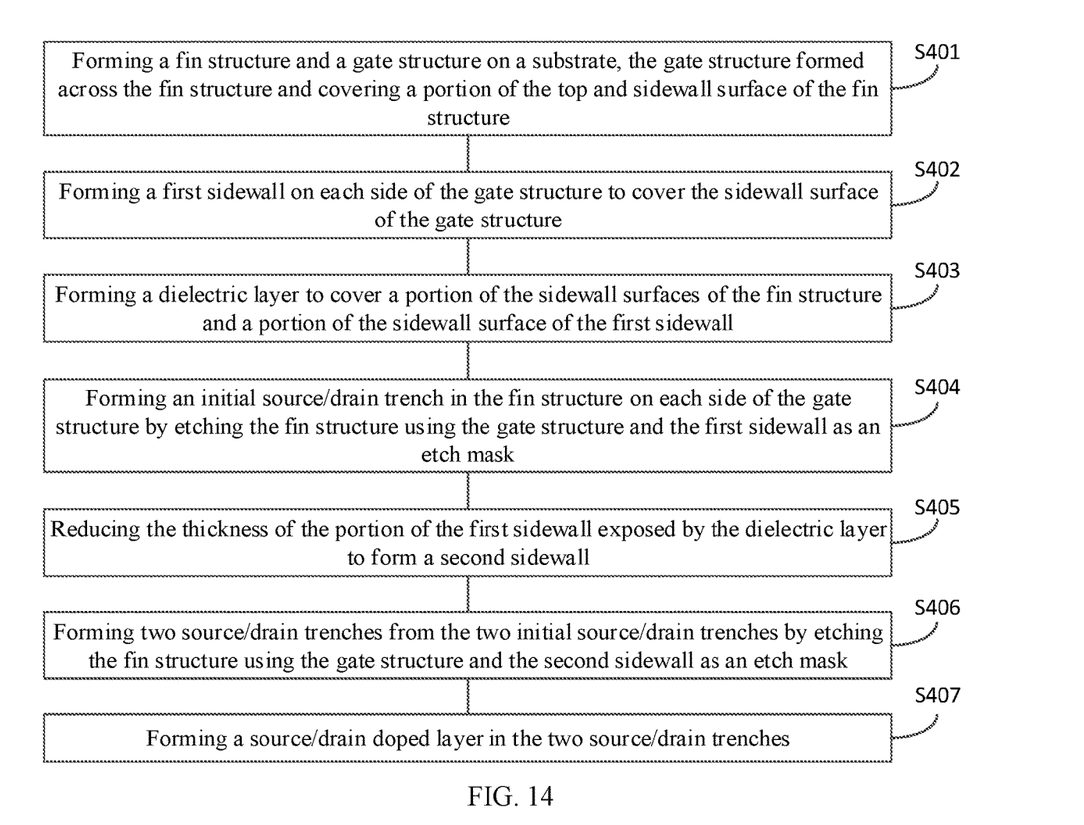
FIG. 14 illustrates a flowchart of an exemplary method for fabricating a semiconductor device consistent with various embodiments of the present disclosure.

FIG. 14 illustrates a flowchart of an exemplary method for fabricating a semiconductor device consistent with various embodiments of the present disclosure. FIGS. 2-13 illustrate schematic views of semiconductor structures at certain stages of the exemplary method.

Figure 2:
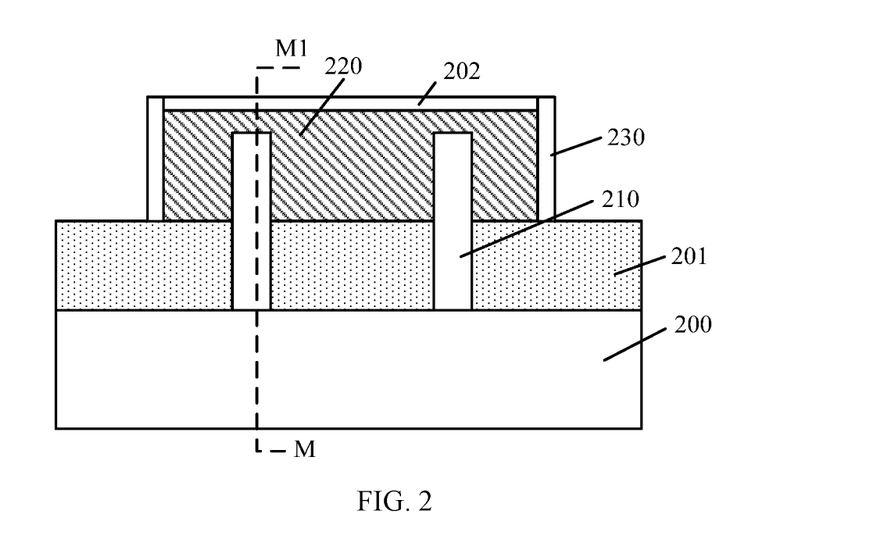
FIGS. 2-13 illustrate schematic views of semiconductor structures at certain stages of an exemplary method for fabricating a semiconductor device consistent with some embodiments of the present disclosure.
Figure 3:
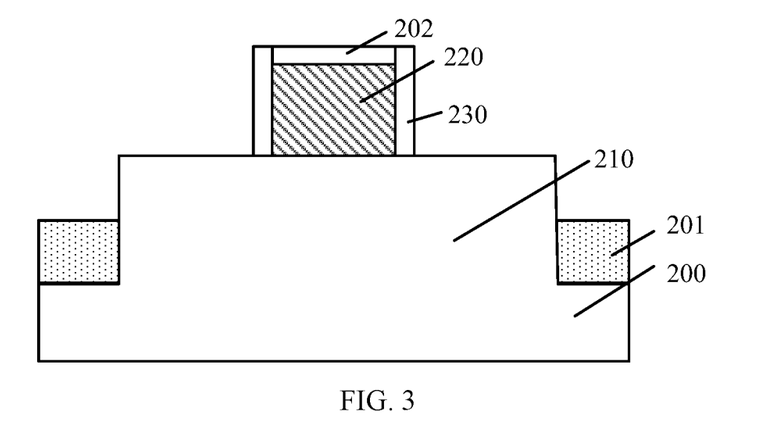

Referring to FIG. 14, a substrate may be provided, and a plurality of fin structures and a plurality of gate structures may be formed on the substrate (S401). FIGS. 2-3 illustrate schematic views of a semiconductor structure consistent with various embodiments of the present disclosure. Specifically, FIG. 3 illustrates a cross-sectional view of the semiconductor structure shown in FIG. 2 along an M-M1 direction.

Referring to FIGS. 2-3, a substrate 200 may be provided. A plurality of fin structures 210 and a plurality of gate structures 220 may be formed on the substrate 200. Each gate structure 220 of the plurality of gate structures 220 may be formed across a plurality of fin structures 210, and may cover a portion of the sidewall and the top surfaces of the plurality of fin structures 210. Although the semiconductor structure may include a plurality of fin structures 210, for illustrative purposes, only two fin structures 210 are shown in FIG. 2 and only one fin structure 210 is shown in FIG. 3. Similarly, in each of FIG. 2 and FIG. 3, only one gate structure 220 is shown as an example to illustrate the exemplary fabrication method.

In one embodiment, an isolation layer 201 may also be formed on the substrate 200. The isolation layer 201 may cover a portion of the sidewall surfaces of each fin structure 210.

The substrate 200 may be made of a semiconductor material such as silicon, germanium, silicon germanium, GaAs, InAs, etc. The silicon material may be signal-crystalline silicon, polycrystalline silicon, or amorphous silicon. Alternatively, the substrate 200 may have a structure with a semiconductor on an insulator. In one embodiment, the substrate 200 may be made of single-crystalline silicon.

In one embodiment, the plurality of fin structures 210 may be formed by patterning the substrate 200. In other embodiments, the plurality of fin structures 210 may be formed by a process including the following exemplary steps. First, a fin-structure material layer may be formed on the substrate, and the fin-structure material layer may be patterned to form the plurality of fin structures.

In one embodiment, the plurality of fin structures 210 may be formed by single-crystalline silicon. In other embodiments, the plurality of fin structures may be formed by single-crystalline germanium silicon, or any other appropriate semiconductor material or structure.

In one embodiment, the isolation layer may be formed by a process including the following exemplary steps. First, an initial isolation film (not shown) may be formed on the substrate 200. The initial isolation film may cover the top surface of the plurality of fin structures 210. The initial isolation film may then be planarized until the top surface of the plurality of fin structures 210 is exposed. Further, the initial isolation film may be etched back to expose a portion of the sidewall surfaces of each fin structure 210. As such the isolation layer 201 may be formed. The isolation layer 201 may be used electrically isolate adjacent fin structures 210.

The initial isolation film may be made of a material including silicon oxide, silicon nitride, or any appropriate material. In one embodiment, the initial isolation film may be made of silicon oxide. The thickness of the initial isolation film removed by the etch-back process may be approximately ¼ to ½ of the height of the fin structure 210. The initial isolation film may be formed by a flowable chemical vapor deposition (FCVD) process or any other appropriate deposition process. In one embodiment, the isolation layer 201 may be made of silicon oxide.

In one embodiment, the gate structure 220 may include a gate dielectric layer (not shown) formed across the fin structure 210, a gate electrode layer (not shown) formed on the gate dielectric layer, and a gate protective layer 202 formed on the top of the gate electrode layer. In some other embodiments, the semiconductor structure may not include the gate protective layer, that is, the gate structure may only include a gate dielectric layer and a gate electrode layer.

In one embodiment, the gate dielectric layer may be made of silicon oxide, and the gate electrode layer may be made of polycrystalline silicon. The gate protective layer 202 may be made of a material including $SiN_x$, SiON, SiCO, SiCN, or SiCON.

Referring to FIGS. 2-3, in one embodiment, the semiconductor structure may further include a sidewall spacer 230 formed on each sidewall surface of the plurality of gate structures 220. The sidewall spacer 230 may be used to protect the sidewall surface of the gate electrode layer, and also define the position of a lightly doped region formed in a subsequent process.

In one embodiment, the sidewall spacer 230 may be formed by a process including the following exemplary steps. First, a sidewall spacer material layer (not shown)

may be formed on the isolation layer 201, the fin structure 210, and the gate structure 220. The sidewall spacer material layer may cover a portion of the sidewall surface and a portion of the top surface of the fin structure 210 as well as the sidewall and the top surfaces of the gate structure 220. The sidewall spacer material layer may be etched back until the top surfaces of the fin structure 210 and the gate protective layer 202 are exposed. As such, a sidewall spacer 230 covering a corresponding sidewall surface of the gate structure 220 may be formed on the fin structure 210. In one embodiment, the sidewall spacer 230 may be made of silicon nitride.

Figure 4:
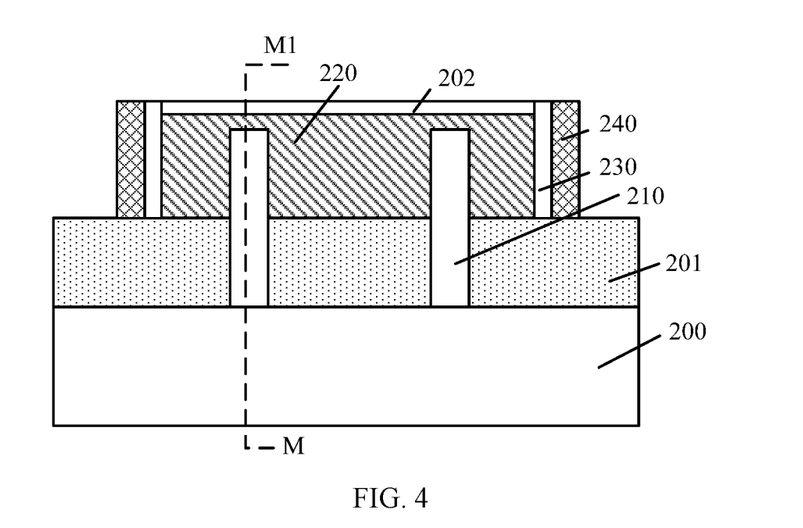
Figure 5:
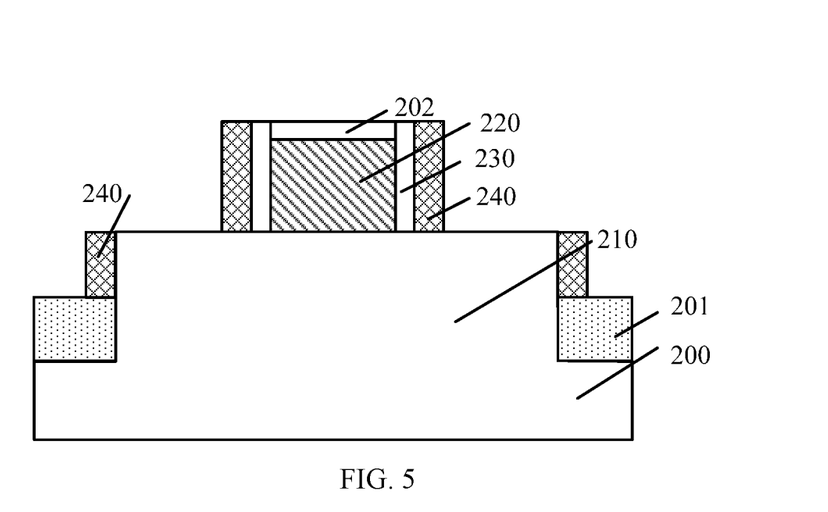

Further, returning to FIG. 14, a first sidewall may be formed on each side of the gate structure to cover the sidewall surface of the gate structure (S402). FIGS. 4-5 illustrate schematic cross-sectional views of a semiconductor structure consistent with various embodiments of the present disclosure. Specifically, the direction of the cross-sectional view shown in FIG. 4 is consistent with the direction of the cross-sectional view shown in FIG. 2, and the direction of the cross-sectional view shown in FIG. 5 is consistent with the direction of the cross-sectional view shown in FIG. 3.

Referring to FIGS. 4-5, a first sidewall 240 may be formed on each side of the gate structure 220 to cover the sidewall surface of the gate structure 220. In one embodiment, because a sidewall spacer 230 is formed on the sidewall surface of the gate structure 220, the first sidewall 240 may be formed to cover the sidewall spacer 230. The first sidewall 240 may also cover the sidewall surfaces of the fin structure 210.

The first sidewall 240 may define a position for a bottom region of a source/drain trench formed in a subsequent process. In one embodiment, the first sidewall 240 may be formed by a process including the following exemplary steps. A first sidewall material layer (not shown) may be formed on the isolation layer 201, the fin structure 210, the gate structure 220, and the sidewall spacer 230. The first sidewall material layer may cover a portion of the sidewall surface and a portion of the top surface of the fin structure 210 as well as the sidewall and the top surfaces of the gate structure 220. The first sidewall material layer may be etched back until the top surfaces of the fin structure and the gate protective layer 202 are exposed. As such, the first sidewall 240 covering a corresponding sidewall surface of the gate structure 220 may be formed on the fin structure 210.

The first sidewall material layer may be made of a material including $SiO_x$, $SiN_x$, SiON, SiCO, SiCN, or SiCON. In one embodiment, the first sidewall material layer may be formed by a chemical vapor deposition (CVD) process, a physical vapor deposition process, or an atomic layer deposition process, and the first sidewall material may be made of $SiN_x$.

In a subsequent process, a source/drain trench may be formed in the fin structure 210 on each side of gate structure 220. That is, two source/drain trenches separated by the gate structure 220 may be formed. Therefore, the dimensions of the gate structure 220, the sidewall spacer 230, and the first sidewall 240 may determine the dimension of the channel between the bottom regions of the two source/drain trenches.

In one embodiment, the thickness of the first sidewall 240 may be in a range of approximately 6 nm to 15 nm. When the thickness of the first sidewall 240 is overly large, the dimension of the channel between the bottom regions of the two source/drain trenches may be too large, and with a fixed dimension of the fin structure 210, the dimension of the source/drain doped layer formed in the bottom region of the source/drain trench may be too small, which may be detrimental to the performance of the semiconductor device. When the thickness of the first sidewall 240 is too small, the dimension of the channel between the bottom regions of the two source/drain trenches may not be sufficiently increased, and thus the SCE in the semiconductor device may not be effectively suppressed.

Figure 6:
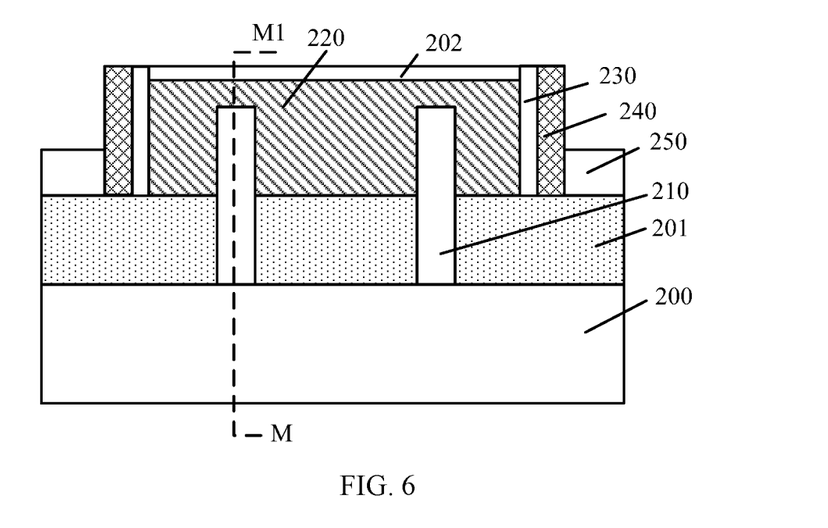
Figure 7:
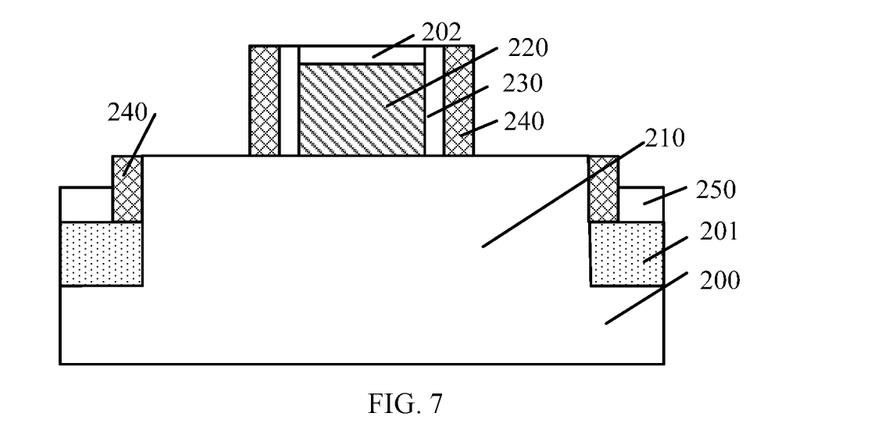

Further, returning to FIG. 14, a dielectric layer may be formed to cover a portion of the sidewall surfaces of the fin structure and also cover a portion of the sidewall surface of the first sidewall (S403). FIGS. 6-7 illustrate schematic cross-sectional views of a semiconductor structure consistent with various embodiments of the present disclosure. Specifically, the direction of the cross-sectional view shown in FIG. 6 is consistent with the direction of the cross-sectional view shown in FIG. 4, and the direction of the cross-sectional view shown in FIG. 7 is consistent with the direction of the cross-sectional view shown in FIG. 5.

Referring to FIGS. 6-7, a dielectric layer 250 may be formed on the isolation layer 201. In one embodiment, the dielectric layer 250 may cover a portion of the sidewall surface of the fin structure 210 and also cover a portion of the sidewall surface of the first sidewall 240. The dielectric layer 250 may serve as a stop layer for forming a second sidewall in a subsequent process. The top surface of the dielectric layer 250 may be lower than the top surface of the fin structure 210.

In one embodiment, the dielectric layer 250 may be formed by a process including the following exemplary steps. An initial dielectric layer (not shown) may be formed on the isolation layer 201, the fin structure 210, the gate structure 220, the sidewall spacer 230, and the first sidewall 240. The initial dielectric layer may cover a portion of the sidewall surface and a portion of the top surface of the fin structure 210 as well as the sidewall and the top surfaces of the gate structure 220. The initial dielectric layer may then be etched back to form the dielectric layer 250 that covers a portion of the sidewall surface of the fin structure 210 and a portion of the sidewall surface of the first sidewall 240.

In one embodiment, the top surface of the dielectric layer 250 may be lower than the top surface of the fin structure 210.

The dielectric layer 250 may be made of a material including $SiO_x$, $SiN_x$, SiON, SiCO, SiCN, or SiCON. In one embodiment, the dielectric layer 250 may be made of $SiO_x$.

Figure 8:
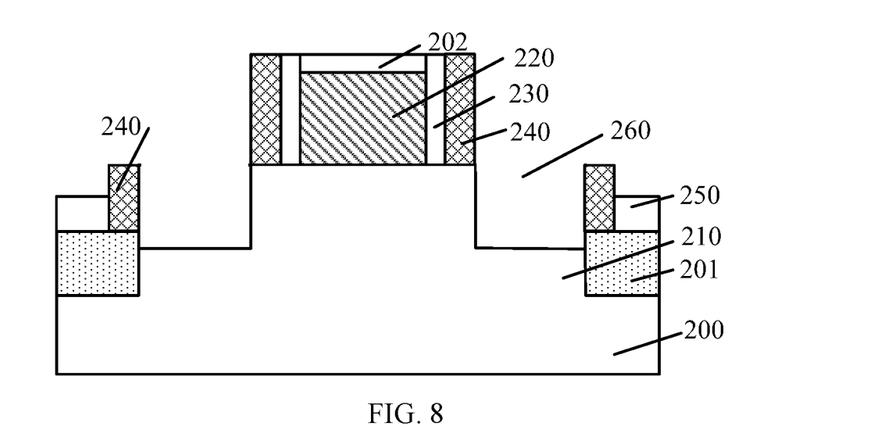

Further, returning to FIG. 14, an initial source/drain trench may be formed in the fin structure on each side of the gate structure (S404). FIG. 8 illustrates a schematic cross-sectional view of a semiconductor structure consistent with various embodiments of present disclosure. Specifically, the direction of the cross-sectional view shown in FIG. 8 is consistent with the direction of the cross-sectional view shown in FIG. 7.

Referring to FIG. 8, by performing a first etching process on the fin structure 210 using the gate structure 220 and the first sidewall 240 as a mask, an initial source/drain trench 260 may be formed in the fin structure 210 on each side of the gate structure 220.

The initial source/drain trench 260 may provide a space for forming a source/drain trench in a subsequent process. The dimension of the initial source/drain trench 260 may be the same as the dimension of the bottom region of a source/drain trench formed in a subsequent process. The dimensions of the gate structure 220, the sidewall spacer 230, and the first sidewall 240 may determine the dimension of the channel between the bottom regions of the two source/drain trenches.

In one embodiment, the depth of the initial source/drain trench 260 may be smaller than the depth of the source/drain trench formed in a subsequent process.

In other embodiments, the depth of the initial source/drain trench 260 may be equal to the depth of the subsequently-formed source/drain trench. Accordingly, during the subsequent process for forming the source/drain trench, a sacrificial layer may be formed in the initial source/drain trench 260 to protect the bottom surface of the initial source/drain trench 260. Moreover, during the subsequent formation of a top region of the source/drain trench, the sacrificial layer may also be used as an etch stop layer.

Figure 9:
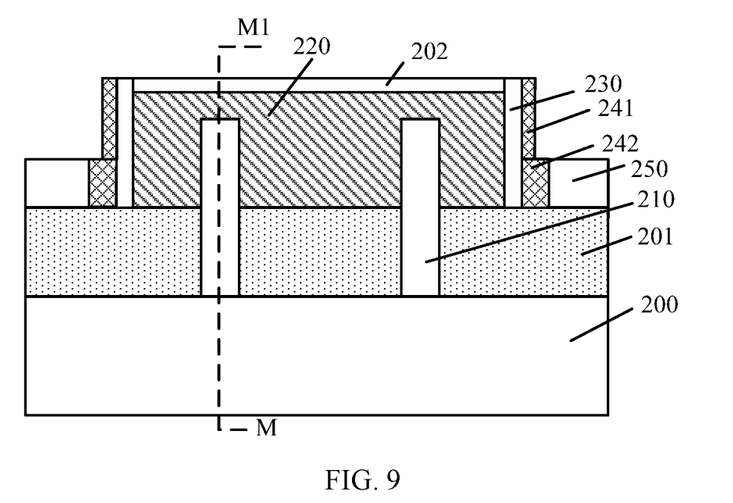

Further, returning to FIG. 14, the thickness of the portion of the first sidewall exposed by the dielectric layer may be reduced to form a second sidewall (S405). FIG. 9 illustrates a schematic cross-sectional view of a semiconductor structure consistent with various embodiments of the present disclosure. Specifically, the direction of the cross-sectional view shown in FIG. 9 is consistent with the direction of the cross-sectional view shown in FIG. 6.

Referring to FIG. 9, after forming the initial source/drain trench 260 in the fin structure 210 on each side of the gate structure 220, the thickness of the portion of the first sidewall 240 exposed by the dielectric layer 250 may be reduced through a thinning-down process to form a second sidewall 241.

The second sidewall 241 may cover the corresponding sidewall surface of the gate structure 220. Moreover, the second sidewall 241 may also cover a portion of the sidewall surface of the fin structure 210.

The method for reducing the thickness of the portion of the first sidewall 240 exposed by the dielectric layer 250 may include removing a portion of the first sidewall 240 by performing an isotropic etching process on the portion of the first sidewall 240 exposed by the dielectric layer 250 to form the second sidewall 241. The isotropic etching process performed on the first sidewall 240 may be a dry etching process.

In one embodiment, after reducing the thickness of the portion of the first sidewall 240 exposed by the dielectric layer 250, the first sidewall 240 may form a third sidewall 242 in addition to the second sidewall 241. For example, the portion of the remaining first sidewall 240 exposed by the dielectric layer 250 may become the second sidewall 241, and the portion of the remaining sidewall 240 with a sidewall surface covered by the dielectric layer 250 may become the third sidewall 242. Therefore, the third sidewall 242 may cover a portion of the sidewall surface of the fin structure 210, the dielectric layer 250 may expose the sidewall surface of the second sidewall 241, and the dielectric layer 250 may cover the sidewall surface of the third sidewall 242 and expose the top surface of the third sidewall 242. The top surface of the third sidewall 242 and the top surface of the dielectric layer 250 may be leveled with each other.

The second sidewall 241 may define a position for a top region of a source/drain trench formed in a subsequent process, and the dimensions of the gate structure 220, the sidewall spacer 230, and the second sidewall 241 may determine the dimension of the channel between the top regions of the two source/drain trenches.

In one embodiment, the thickness of the second sidewall 241 may be in a range of approximately 2 nm to 5 nm. When the thickness of the second sidewall 241 is overly large, the source/drain doped layer may not be able to provide sufficient stress to the channel, which may be detrimental to the performance of the semiconductor device. When the thickness of the second sidewall 241 is too small, the dimension of the channel between the top regions of the two source/drain trenches may be too small, which may easily cause the SCE in the semiconductor device.

Figure 10:
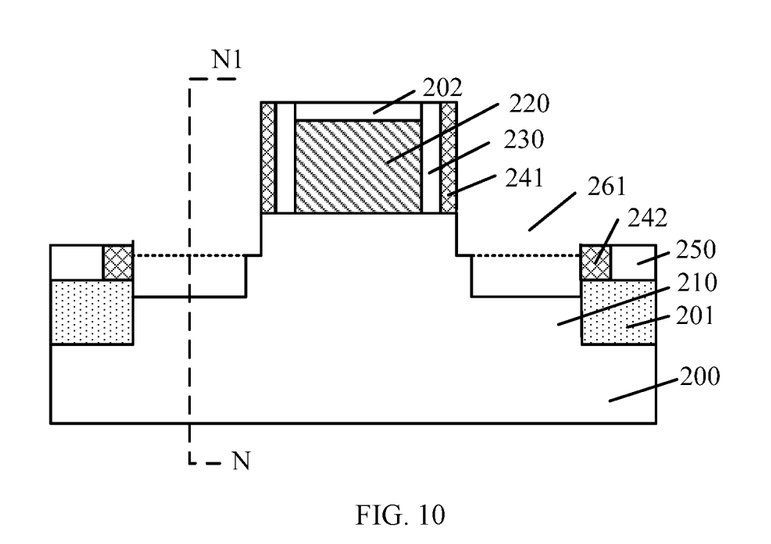
Figure 11:
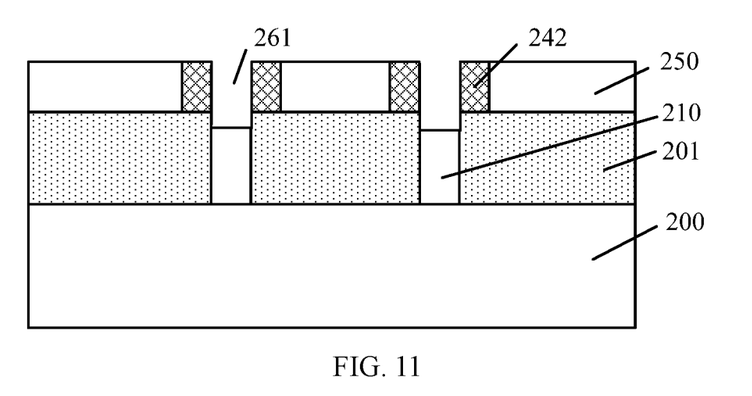

Further, returning to FIG. 14, after forming the second sidewall, a source/drain trench may be formed by etching the fin structure using the gate structure and the second sidewall as an etch mask (S406). FIG. 10-11 illustrate cross-sectional views of a semiconductor structure consistent with various embodiments of the present disclosure. Specifically, FIG. 10 illustrates a cross-sectional view of the semiconductor structure shown in FIG. 9 along an M-M1 direction after the source/drain trench is formed, and FIG. 11 illustrates a cross-sectional view of the semiconductor structure shown in FIG. 10 along an N-N1 direction.

Referring to FIGS. 10-11, after forming the second sidewall 241, a source/drain trench 261 may be formed in the fin structure 210 on each side of the gate structure 220 by etching the fin structure 210 using the gate structure 220 and the second sidewall 241 as an etch mask. That is, corresponding to each gate structure 220, two source/drain trenches 261 may be formed, and the two source/drain trenches 261 may be separated by the gate structure 220. Each source/drain trench 261 may include a bottom region and a top region above the bottom region.

In one embodiment, in the extension direction of the fin structure 210, the distance between the sidewall surface of the top region of the source/drain trench 261 and the sidewall surface of the bottom region of the source/drain trench 261 may be in a range of approximately 30 nm to 45 nm.

In one embodiment, the etching process performed on the fin structure 210 for forming the source/drain trench 261 may be an isotropic dry etching process. The etching process may adopt the following process parameters. In the first stage of etching, an etch gas may include $CF_4$ and $H_2$ with a flow rate of $CF_4$ in a range of approximately 10 sccm to 300 sccm and a flow rate of $H_2$ in a range of approximately 20 sccm to 500 sccm, a process temperature may be in a range of approximately 50° C. to 100° C., and a process time may be in a range of approximately 5 s to 50 s; in the second stage of etching, an etch gas may include $CH_3F$, $O_2$, and He with a flow rate of $CH_3F$ in a range of approximately 60 sccm to 800 sccm, a flow rate of $O_2$ in a range of approximately 5 sccm to 200 sccm, and a flow rate of He in a range of approximately 60 sccm to 200 sccm, a process temperature may be in a range of approximately 25° C. to 65° C., and a process time may be in a range of approximately 5 s to 100 s.

By controlling the etch time, the etching depth may be controlled, such that the depth of the top region of the source/drain trench 261 may be controlled. In some embodiments, the ratio of the depth of the top region of the source/drain trench 261 to the depth of the source/drain trench 261 may be controlled in a range of approximately 1:2 to 1:3.

In one embodiment, the depth of the top region of the source/drain trench 261 may be 15 nm to 25 nm. When the depth of the top region of the source/drain trench 261 is too small, the source/drain doped layer formed in the top region of the source/drain trench 261 in a subsequent process may not be able to provide sufficient stress to the channel, resulting in undesired performance of the semiconductor device. When the depth of the source/drain trench 261 is too large, with the depth of the source/drain trench 261 is fixed, the SCE may be easily introduced into the channel in the source/drain doped layer between the bottom regions of the two source/drain trenches 261.

In one embodiment, the dimensions of the gate structure 220, the sidewall spacer 230, and the first sidewall 240 may determine the dimension of the channel between the bottom regions of the two source/drain trenches 261; and the dimensions of the gate structure 220, the sidewall spacer 230, and the second sidewall 241 may determine the dimension of the channel between the top regions of the two source/drain trenches 261.

In one embodiment, the ratio of the dimension of the fin structure 210 between the top regions of the two source/drain trenches 261 to the dimension of the fin structure 210 between the bottom regions of the two source/drain trenches 261 may be in a range of approximately 1:1.1 to 1:1.3. For example, the dimension of the fin structure 210 between the top regions of the two source/drain trenches 261 may be in a range of approximately 18 nm to 30 nm; and the dimension of the fin structure 210 between the bottom regions of the two source/drain trenches 261 may be in a range of approximately 20 nm to 40 nm. The dimension of the fin structure 210 between the bottom regions of the two source/drain trenches 261 may be the length of the channel between the bottom regions of the two source/drain trenches 261.

In one embodiment, the two source/drain trenches 261 may be located in the fin structure 210 on the two sides of the gate structure 220, respectively. Each source/drain trench 261 may include a bottom region and a top region. Along the extension direction of the fin structure 210, the dimension of the top region may be larger than the dimension of the bottom region. The shortest distance from the sidewall surface of the top region to the sidewall surface of the gate structure 220 may be smaller than the shortest distance from the sidewall surface of the bottom region to the sidewall surface of the gate structure 220, such that the distance between the bottom regions of the two source/drain trenches 261 may be large, and thus the dimension of the fin structure between the bottom regions of the source/drain trenches 261 may also be large. Therefore, the distance between the two portions of the source/drain doped layer formed in the bottom regions of the two source/drain trenches 261 may be large. In the semiconductor device, the source/drain doped layer is located in the two source/drain trenches 261, and the portion of the fin structure 210 between the two portions of the source/drain doped layer that are respectively in the two source/drain trenches 261 serves as the channel of the semiconductor device. When the dimension of the channel between the two portions of the source/drain doped layer formed in the bottom regions of the two source/drain trenches 261 is large, the width of the depletion layer formed when voltages are applied on the source/drain doped layer may be smaller than the length of the channel, such that the SCE may be suppressed. Therefore, the performance of the semiconductor device may be improved.

Further, returning to FIG. 14, a source/drain doped layer may be formed in the two source/drain trenches (S407). FIGS. 12-13 illustrate schematic cross-sectional views of a semiconductor structure consistent with various embodiments of the present disclosure. Specifically, the direction of the cross-sectional view shown in FIG. 12 is consistent with the direction of the cross-sectional view shown in FIG. 10, and the direction of the cross-sectional view shown in FIG. 13 is consistent with the direction of the cross-sectional view shown in FIG. 11.

Referring to FIGS. 12-13, a source/drain doped layer 270 may be formed in the two source/drain trenches 261 that are formed in the fin structure 210 on the two sides of the gate structure 220. The source/drain doped layer 270 may be formed in the two source/drain trenches 261 through an epitaxial growth process.

In one embodiment, during the formation of the source/drain doped layer 270, the fabrication method may further include performing an in-situ doping process to introduce source/drain doping ions into the source/drain doped layer.

In one embodiment, when the gate structure 220 is used to form a P-type device, the source/drain doped layer 270 may be made of germanium silicon doped with source/drain doping ions, and the source/drain doping ions may be P-type conduction ions. For example, the source/drain doping ions may include boron ions, $BF^{2+}$ ions, or indium ions.

In other embodiments, when the gate structure 220 is used to form an N-type device, the source/drain doped layer 270 may be made of silicon doped with source/drain doping ions, and the source/drain doping ions may be N-type conduction ions. For example, the source/drain doping ions may include phosphor ions, arsenic ions, or antimony ions.

The source/drain doped layer 270 may be located in the two source/drain trenches 261, and the portion of the fin structure 210 between the two portions of the source/drain doped layer 270 may be the channel of the semiconductor device. When the dimension of the channel between the two portions of the source/drain doped layer 270 formed in the bottom regions of the two source/drain trenches 261 is large, the width of the depletion layer formed when voltages are applied on the source/drain doped layer 270 may be smaller than the length of the channel, such that the SCE may be suppressed. Therefore, the performance of the semiconductor device may be improved.

Further, the present disclosure also provides a semiconductor device formed using the method described above. FIG. 12 illustrates a schematic cross-sectional view of a semiconductor device consistent with various embodiments of the present disclosure.

Referring to FIG. 12, the semiconductor device may include a substrate 200, and a plurality of fin structures 210 and a plurality of gate structures 220 formed on the substrate 200. Each gate structure 220 of the plurality of gate structures 220 may be formed across a plurality of fin structures 210, and may cover a portion of the sidewall and the top surfaces of the plurality of fin structures 210. Although the semiconductor device may include more than one fin structure 210, for illustrative purposes, only one fin structure 210 is shown in FIG. 12. Similarly, although the semiconductor device may include more than one gate structure 220, only one gate structure 220 is shown as an example in FIG. 12 to illustrate the semiconductor device.

The semiconductor device may further include a source/drain trench (not shown) formed in the fin structure 210 on each side of the gate structure 220. That is, corresponding to each gate structure 220, the semiconductor device may include two source/drain trenches respectively formed on the two sides of the gate structure 220. Each source/drain trench may include a bottom region and a top region above the bottom region. Along the extension direction of the fin structure, the dimension of the top region may be larger than the dimension of the bottom region. The shortest distance from the sidewall surface of the top region to the sidewall surface of the gate structure 220 may be smaller than the shortest distance from the sidewall surface of the bottom region to the sidewall surface of the gate structure 220.

Moreover, the semiconductor device may further include a source/drain doped layer 270 formed in the source/drain doped trench.

For the detailed description of the substrate 200, reference may be made to the corresponding content described in the embodiments above. For the detailed description of the structure and the position of the gate structure 270, reference may be made to the corresponding content described in the embodiments above. Similarly, for the detailed description of material and the position of the source/drain doped layer 270, reference may be made to the corresponding content described in the embodiments above.

Compared to existing semiconductor devices and fabrication methods, the disclosed semiconductor device and fabrication method may demonstrate the following exemplary advantages.

According to the disclosed semiconductor device and fabrication method, on each side of a gate structure, a source/drain trench is formed in the fin structure. That is, corresponding to each gate structure, two source/drain trenches are formed. The source/drain trench includes a bottom regions and a top region. Along the extension direction of the fin structure, the dimension of the top region is larger than the dimension of the bottom region, and the shortest distance from the sidewall surface of the top region to the sidewall surface of the gate structure is smaller than the shortest distance from the sidewall surface of the bottom region to the sidewall surface of the gate structure. As such, the distance between the bottom regions of the two source/drain trenches may be large, and thus the dimension of the portion of the fin structure between the bottom regions of the two source/drain trenches may also be large. Therefore, the distance between the two portions of the source/drain doped layer formed in the bottom regions of the two source/drain trenches may be large. In the semiconductor device, the source/drain doped layer is located in the two source/drain trenches, and the portion of the fin structure between the two portions of the source/drain doped layer that are respectively in the two source/drain trenches is the channel of the semiconductor device. When the dimension of the channel between the two portions of the source/drain doped layer formed in the bottom regions of the two source/drain trenches is large, the width of the depletion layer formed when voltages are applied on the source/drain doped layer may be smaller than the length of the channel, such that the SCE may be suppressed. Therefore, the performance of the semiconductor device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor device, comprising:
   a substrate;
   a fin structure and a gate structure formed on the substrate, wherein the gate structure is formed across the fin structure and covers a portion of top and sidewall surfaces of the fin structure;
   a source/drain trench formed in the fin structure on each side of the gate structure, wherein:
   the source/drain trench includes a bottom region and a top region located above the bottom region,
   along an extension direction of the fin structure, a dimension of the top region is larger than a dimension of the bottom region, and
   along the extension direction of the fin structure, a shortest distance from a sidewall surface of the top region of the source/drain trench to a sidewall surface of the gate structure is smaller than a shortest distance from a sidewall surface of the bottom region of the source/drain trench to the sidewall surface of the gate structure; and
   a source/drain doped layer formed in the source/drain trench.

2. The semiconductor device according to claim 1, wherein:
   a ratio of a dimension of the fin structure between the top region of the source/drain trench on one side of the gate structure and the top region of the source/drain trench on another side of the gate structure to a dimension of the fin structure between the bottom region of the source/drain trench on one side of the gate structure and the bottom region of the source/drain trench on another side of the gate structure is in a range of approximately 1:1.1 to 1:1.3.

3. The semiconductor device according to claim 1, wherein:
   a ratio of a depth of the top region of the source/drain trench to a depth of the source/drain trench is in a range of approximately 1:2 to 1:3.

4. The semiconductor device according to claim 1, further including:
   a first sidewall on each sidewall surface of the gate structure.

5. The semiconductor device according to claim 4, wherein:
   a thickness of the first sidewall is in a range of approximately 2 nm to 5 nm.

6. The semiconductor device according to claim 1, further including:
   a dielectric layer on the substrate, wherein the dielectric layer covers a sidewall surface of the second sidewall.

7. The semiconductor device according to claim 1, wherein:
   along the extension direction of the fin structure, a distance between the sidewall surface of the top region of the source/drain trench and the sidewall surface of the bottom region of the source/drain trench is in a range of approximately 30 nm to 45 nm.

8. The semiconductor device according to claim 1, wherein:
   a ratio of a dimension of the fin structure between the top region of the source/drain trench on one side of the gate structure and the top region of the source/drain trench on another side of the gate structure to a dimension of the fin structure between the bottom region of the source/drain trench on one side of the gate structure and the bottom region of the source/drain trench on another side of the gate structure is in a range of approximately 1:1.1 to 1:1.3.

9. The semiconductor device according to claim 1, wherein:
   a dimension of the fin structure between the bottom region of the source/drain trench on one side of the gate structure and the bottom region of the source/drain trench on another side of the gate structure is in a range of approximately 20 nm to 40 nm.

10. The semiconductor device according to claim 1, wherein:
- a dimension of the fin structure between the top region of the source/drain trench on one side of the gate structure and the top region of the source/drain trench on another side of the gate structure is in a range of approximately 18 nm to 30 nm.

11. The semiconductor device according to claim 1, wherein:
- a ratio of a depth of the top region of the source/drain trench to a depth of the source/drain trench is in a range of approximately 1:2 to 1:3.

12. The semiconductor device according to claim 1, wherein:
- a depth of the top region of the source/drain trench is in a range of approximately 15 nm to 25 nm.

13. The semiconductor device according to claim 1 wherein
- when the gate structure is used to form a P-type device, the source/drain doped layer is made of germanium silicon doped with P-type source/drain doping ions, including boron ions, $BF^{2+}$ ions, or indium ions; and
- when the gate structure is used to form an N-type device, the source/drain doped layer is made of silicon doped with N-type source/drain doping ions, including phosphor ions, arsenic ions, or antimony ions.

* * * * *